United States Patent [19]

Lenz

[11] 4,177,425

[45] Dec. 4, 1979

[54] MULTIPLE CONTACT ELECTRICAL TEST PROBE ASSEMBLY

[76] Inventor: Seymour Lenz, P.O. Box 104, Altamonte Springs, Fla. 32701

[21] Appl. No.: 830,424

[22] Filed: Sep. 6, 1977

[51] Int. Cl.$^2$ .................... G01R 1/06; G01R 31/02
[52] U.S. Cl. ........................... 324/158 P; 324/72.5
[58] Field of Search ............ 324/158 P, 158 F, 72.5, 324/149; 339/108 TP

[56] References Cited

U.S. PATENT DOCUMENTS

| | | | |
|---|---|---|---|
| 3,560,907 | 2/1971 | Heller | 324/158 F |
| 3,866,119 | 2/1975 | Ardezzone et al. | 324/158 F |
| 3,996,514 | 12/1976 | Brown et al. | 324/158 P |

OTHER PUBLICATIONS

Bove, R.; "Kelvin Probe"; IBM Tech. Dis. Bull.; vol. 13; No. 1; Jun. 1970; pp. 169–170.

Caccoma et al.; "AC Probe"; IBM Tech. Dis. Bull.; vol. 12; No. 10; Mar. 1970; p. 1667.

Primary Examiner—Rudolph V. Rolinec
Assistant Examiner—Ernest F. Karlsen
Attorney, Agent, or Firm—Duckworth, Hobby, Allen & Pettis

[57] ABSTRACT

A multiple contact test probe assembly for testing miniature electronic circuit devices includes a non-conductive support having a plurality of spaced slots extending therethrough, all of the slots being substantially parallel and lying in a common plane. The assembly is provided with a plurality of electrically conductive contact elements, each element dimensioned to press fit within at least one of the slots and having a bend between the ends of each element to restrict sliding through the corresponding slot. At least one end of each contact element is adapted to sequentially engage a miniature electronic circuit for testing purposes, each contact element having sufficient tensile strength to withstand sequential testing of the circuit devices.

11 Claims, 3 Drawing Figures

MULTIPLE CONTACT ELECTRICAL TEST PROBE ASSEMBLY

BACKGROUND OF THE INVENTION

1. Field of the Invention

The present invention relates generally to electronic testing assemblies, and more particularly to a multiple contact test probe assembly useful for testing integrated and hybrid electronic circuits.

2. Description of the Prior Art

Recent developments in hybrid and integrated electronic circuits have resulted in progressive miniaturization of these devices. In the manufacture of these circuits, it is necessary to conduct tests to determine the circuits electronic characteristics, in order to discover defective devices prior to or after packaging. Further, it is a common practice of the purchaser of such devices to conduct tests prior to using the equipment in which the devices are installed. This multiple testing demands testing equipment capable of performing these tests at high rates of speed with precision.

With regard to such test equipment, there has been developed test probe cards which generally consist of an insulated printed circuit board having an opening to provide access to an integrated circuit, or electronic circuit positioned adjacent to, or underneath the board. The opening is surrounded by a ring of test probes, each of which is bound to the circuit board and each of which has a probe for making contact to a pre-determined contact pad on the circuit under test. Examples of such prior art arrangements are disclosed in the following United States patents: U.S. Pat. Nos. 3,560,907 to Heller; 3,866,119 to Ardezzone.

In the past, it has been the custom to use point-type needle contacts to make electrical contacts for testing purposes. Frequently, the distance between each corresponding probe arm and the extremity of the conductive tip differs; as a result, some of the tips will "dig" into the corresponding conductive pad on the electronic circuit, while other tips may not make sufficient electrical contact at all. It is, therefore, desirable to provide some means for adjusting for slight changes in the distance between the end of the conductive tip and the metallic pad to be contacted by the tip on the circuit under test, and to further provide some flexure in the tip so as to prevent destruction of the metallic contact pad.

Another difficulty experienced with the testing of electronic circuits of this type is the buildup of a surface oxide coating on the metallic contact pads located on the device being tested. Unless these surface oxide coatings are removed, a correct electrical connection by the test probe to the underlying contact pad cannot be made for testing purposes.

In the construction of packages useful in integrated circuit technology, a type of circuit known as a "dual in-line" package has been developed. The "dual in-line" package consists of multiple contacts or leads which extend from a non-conductive material which encases the active circuit element. Dual in-line packages are characterized by the leads being in different planes. It is, therefore, necessary in the testing of such devices to provide means for making contact with the electrical leads of packages in which the leads may be in different planes.

SUMMARY OF THE INVENTION

The present invention contemplates a multiple contact electrical test probe assembly for contacting and testing miniature electrical circuit devices, the assembly comprising a support of an electrically non-conductive material, the support having a plurality of spaced holes, such as slots, extending through the support from one side of the support to the opposite side. All of the holes are substantially parallel with each other and lie in a common plane. A plurality of electrically conductive contact elements are also provided, each element dimensioned to a light press fit in at least one of the holes and having a bend between the ends thereof to restrict sliding through the corresponding hole. At least a first end of the contact element is adapted to sequentially engage a plurality of miniature electronic circuit devices for testing purposes. Each contact element has a sufficient tensile strength to withstand the sequential testing of the circuit devices. Means are further provided for mounting the assembly in spaced relationship with the circuit devices being tested.

In a preferred embodiment of the present invention, the bend is formed along each contact element at a point which causes one end portion to be longer than the other end portion, such that the contact element may be reversed so as to engage contacts (or leads) of the circuit device under test at different levels, i.e. in the case of a dual in-line package. A further aspect of the preferred embodiment of the present invention incorporates a cross-sectional shape of each contact element which provides an elongated edge surface in contact with the circuit device under test, whereby the edge surface facilitates the scrapping through of any surface oxide coatings on the circuit device during relative movement between the contact element and the circuit device. Further, the bend along each circuit element forms an obtuse angle, defined below as theta, between the two end portions defined by the bend. When each contact element is properly positioned in the respective hole in the support and the support is fastened to a test fixture in an appropriate manner, then the respective end of each contact element engaging a portion of the circuit device under test provides a relative degree of flexibility so as to avoid damage to the circuit devices under test.

THE DRAWING

DESCRIPTION OF THE PREFERRED EMBODIMENT

Figure 1:
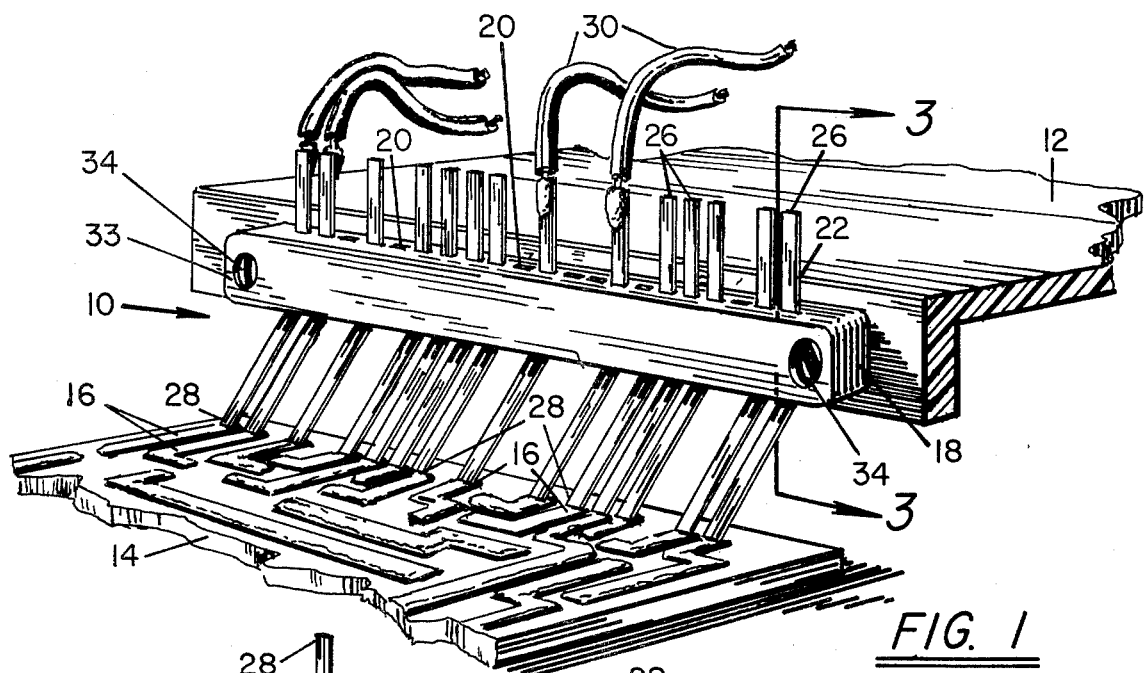
FIG. 1 is a prospective view illustrating a preferred embodiment of the present invention.

The preferred embodiment of the present invention can now be described with reference to the drawing.

Figure 3:
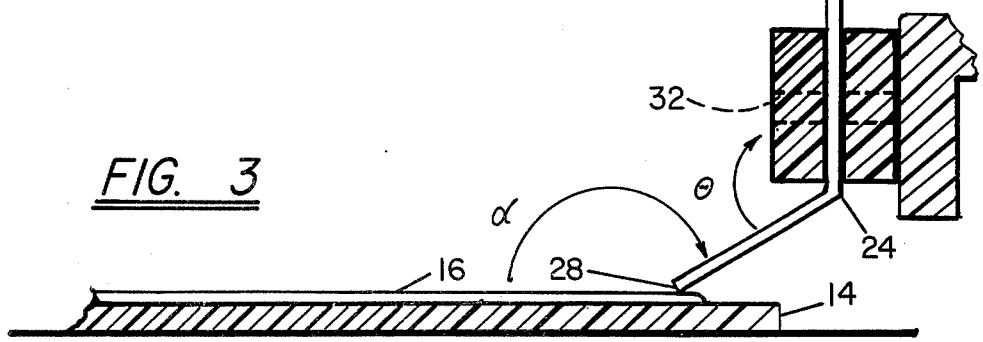
FIG. 3 is a cross-sectional view, taken along the lines 3—3, of FIG. 1.

With specific reference to FIGS. 1 and 3, the test probe assembly referred to generally as 10, is shown as adapted to be connected to a test fixture 12 of conventional design. As described above, the assembly 10 is designed to test a miniature electronic circuit device 14 having a plurality of conductive contact pads 16. By way of example, the device 14 may comprise a typical hybrid electronics circuit.

The assembly 10 is provided with a non-conductive support 18 having a plurality of spaced slots 20 extending through the support from the top to the bottom, as the assembly 10 is arranged in position against the test fixture 12. All of the slots 20 are substantially parallel and lying in a common plane; preferably, the slots 20 have a rectangular cross-section, and are suitably designed to conform to the cross-sectional shape of the contact elements 22 described next.

The assembly 10 is provided with a plurality of conductive contact elements 22, each contact preferably having a rectangular cross-section and preferably formed of a malleable precious metal or an alloy of two or more precious metals. It will be noted that, while it is desirable to have a rectangular cross-section, other cross-sectional shapes are suitable. It is, however, desirable in accordance with the present invention to provide it an elongated edge surface at the one or both ends of the contact element 22 which is to come in contact with the circuit device under test, whereby the edge surface scrapes through any surface oxide on the circuit device during relative movement between the device under test and the assembly.

Figure 2:
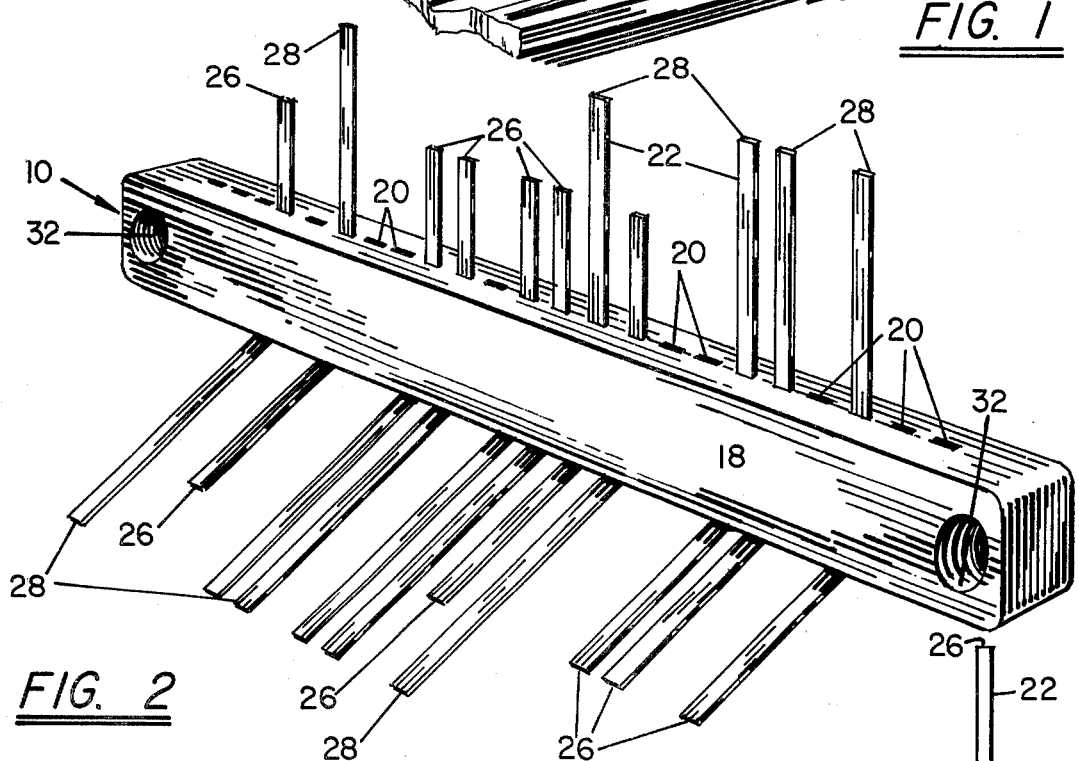
FIG. 2 is a prospective view of a portion of the apparatus shown in FIG. 1, in which certain of the contact elements have been rearranged to illustrate the versatility of the assembly in accordance with the preferred embodiment.

With specific reference to FIG. 3, each contact element 22 is provided with the bend 24 which is faced along each contact element so as to make one end portion longer than the other, and forming an obtuse angle theta, which is suitably 120°. The first and second ends 26, 28 of each contact element 22 likewise include the rectangular cross-sectional shape, each contact element being positioned in one of the slots 20. Preferably, all of the slots 20 have identical dimensions, and all of the contact elements 22 likewise have identical dimensions, such that each contact element is interchangeable with the other and each of the respective holes 20. Further, as is shown in FIG. 2, each contact element 22 may be removed from the corresponding slot 20 and reversed, allowing the other end to make contact with the circuit device under test. In this way, necessary testing of so-called "dual in-line" circuit packages can be effectuated.

As will be understood by those skilled in the art, each of the respective ends 26, 28 not in contact with the circuit device 14 is connected to another electronic circuit which facilitates the testing of the circuit device 14. Connection to this external test circuit is made by way of conductive straps such as shown at 30 in FIG. 1.

Now noting FIGS. 1, 2 and 3, the test assembly 10 is provided with apparatus 32 extending through the support member 18 substantially normal to the axis of the slot 20 and substantially normal to a base 33 of the support member, the base 33 being substantially parallel with the plane of the slot 20. Fasteners, such as screws 34 extend through the holes 32 and engage to test fixture 12 to hold the entire assembly 10 firmly in place. When properly fastened to the fixture 12, the end portion of the contact element 22 which is to engage in circuit element 14 forms an obtuse angle alpha with respect to the plane of the upper surface of the circuit element 14. It will be appreciated by those skilled in the art that this arrangement allow circuit devices being tested to be advanced underneath the test fixture 10 with a minimum of unnecessary motion.

I claim:

1. A multiple contact electrical test probe assembly for contacting and testing miniature electronic circuit devices lying in a first plane, said assembly comprising:
   a support of an electrically non-conductive material, said support having a plurality of spaced holes extending through said support from one side of said support to an opposing side thereof all of said holes being substantially parallel and lying in a common plane which is substantially normal to said first plane;
   a plurality of electrically conductive contact elements, each element dimensioned to a press fit within at least one of said holes and having a bend between the ends thereof to restrict sliding through the corresponding hole;
   at least a first end of each said contact element adapted to sequentially engage a plurality of miniature electronic circuit devices for testing purposes;
   each contact element having sufficient tensile strength to withstand said sequential testing of said circuit devices;
   means for mounting said assembly in space relationship with said circuit device being tested;
   wherein each said bend is positioned between said support and said circuit device being tested, and separates said corresponding contact element into two end portions, a first end portion including said first end and being longer than the second end portion which includes said second end; and wherein
   both said first and second ends of each said contact element is adapted to sequentially engage a plurality of miniature electronic circuit devices for testing purposes, by sliding from the corresponding hole and reversal of the corresponding contact element.

2. The test probe assembly recited in claim 1 wherein the second end of each said contact element adapted to be coupled with a test assembly to facilitate testing of said circuit device.

3. The test probe assembly recited in claim 2 wherein both said first and second ends of each said contact element is adapted to be coupled with a test assembly to facilitate testing of said circuit devices.

4. The test probe assembly recited in claim 3 wherein said bend forms an obtuse angle between said first and second end portions of each said contact element.

5. The test probe assembly recited in claim 4 wherein said holes of said contact elements are all equally dimensioned, such that each said contact element is slidable through each said hole.

6. The test probe assembly recited in claim 5 through the comprising fastening means for joining said probe assembly to said test assembly.

7. The test probe assembly recited in claim 6 wherein said fastening means comprises:
   said support including at least a pair of spaced mounting appertures extending through said support member substantially normal to the axis of said holes and substantially normal to a face of said support member which is substantially parallel with the plane of said holes; and
   a fastener extending through each apperture and adapted to joint with adjacent test fixtures.

8. The test probe assembly recited in claim 7 wherein said support is adapted to be mounted to said test fixture such that one of said first and second ends engages a certain device under test with the corresponding end portion, forming an obtuse angle with respect to the plane of said circuit device.

9. The test probe assembly recited in claim 8 wherein each said contact element has a cross-sectional shape providing an elongated edge surface in contact with said circuit device under test, whereby said edge surface scrapes through any non-conductive surface coating on said circuit device during relative movement therebetween.

10. A multiple contact electrical test probe assembly contacting and testing miniature electronic circuit devices, comprising:
- a support of an electrically non-conductive material, said support having a plurality of spaced holes extending through said support from one side of said support to an opposing side thereof, all of said holes being substantially parallel and lying in a common plane;
- a plurality of electrically conductive contact elements, each element dimensioned to slidably fit within at least one of said holes and having a bend between the ends thereof to restrict sliding through the corresponding hole;
- at least a first end of each said contact element adapted to sequentially engage a plurality of miniature electronic circuit devices for testing purposes;
- each contact element having sufficient tensile strength to withstand said sequential testing of said circuit devices;
- means for mounting said assembly in space relationship with said circuit device being tested;
- said contact elements having a substantially cross-sectional shape providing an elongated edge surface in contact with said circuit device under test, whereby said edge surface scrapes through any surface coating on said circuit device during relative movement therebetween;
- said support being adapted to be mounted to said test fixture such that one of said first and second ends engages a circuit device under test with the corresponding end portion forming an obtuse angle with respect to the plane of said circuit device; and wherein
- each said bend separates the corresponding one of said contact elements into two end portions, the first end portion including said first end and being longer than the second end portion, which includes said second end, whereby selected ones of said contact elements may be reversed so as to engage said circuit device at different levels and in different planes.

11. The test probe assembly recited in claim 10 wherein each contact element consists essentially of a malleable precious metal.

* * * * *